(12) United States Patent
Kang et al.

(10) Patent No.: US 8,779,580 B2
(45) Date of Patent: Jul. 15, 2014

(54) ELECTRONIC COMPONENT PACKAGE AND MANUFACTURING METHOD THEREOF

(75) Inventors: Joon-Seok Kang, Suwon-si (KR); Sung Yi, Suwon-si (KR); Jae-Cheon Doh, Suwon-si (KR); Do-Jae Yoo, Seoul (KR); Sun-Kyong Kim, Seoul (KR); Jong-Hwan Baek, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 1552 days.

(21) Appl. No.: 12/010,321

(22) Filed: Jan. 23, 2008

(65) Prior Publication Data

US 2008/0212288 A1 Sep. 4, 2008

(30) Foreign Application Priority Data

Mar. 2, 2007 (KR) .................. 10-2007-0020940

(51) Int. Cl.
*H01L 23/10* (2006.01)
*H01L 23/34* (2006.01)

(52) U.S. Cl.
USPC ............... 257/707; 257/E21.499; 257/706; 257/713; 438/122

(58) Field of Classification Search
CPC .......................................... H01L 2924/01079
USPC .......... 257/E21.499, 681, 687, 704–707, 712, 257/713; 438/118, 119, 122, 584; 29/455.1, 29/469, 841; 361/717
See application file for complete search history.

(56) References Cited

U.S. PATENT DOCUMENTS

| | | | | |
|---|---|---|---|---|
| 4,801,998 A * | 1/1989 | Okuaki | .................... | 257/681 |
| 5,817,545 A * | 10/1998 | Wang et al. | .................... | 438/127 |
| 6,008,536 A * | 12/1999 | Mertol | .................... | 257/704 |
| 6,016,006 A * | 1/2000 | Kolman et al. | .................... | 257/712 |
| 6,187,613 B1 * | 2/2001 | Wu et al. | .................... | 438/108 |
| 6,188,578 B1 * | 2/2001 | Lin et al. | .................... | 361/717 |
| 6,617,682 B1 * | 9/2003 | Ma et al. | .................... | 257/706 |
| 6,747,350 B1 * | 6/2004 | Lin et al. | .................... | 257/704 |
| 6,891,259 B2 * | 5/2005 | Im et al. | .................... | 257/687 |
| 6,979,600 B2 * | 12/2005 | Brandenburger | .................... | 438/127 |
| 7,040,011 B2 * | 5/2006 | Tanaka et al. | .................... | 29/832 |
| 7,163,840 B2 * | 1/2007 | Chen et al. | .................... | 438/108 |
| 7,202,111 B2 * | 4/2007 | Chiu | .................... | 438/122 |
| 8,115,301 B2 * | 2/2012 | Kim et al. | .................... | 257/706 |

FOREIGN PATENT DOCUMENTS

JP 2002-100872 4/2002

OTHER PUBLICATIONS

Japanese Office Action issued Oct. 5, 2010 in corresponding Japanese Patent Application 2008-001872.

* cited by examiner

*Primary Examiner* — Chris Chu

(57) ABSTRACT

An electronic component package and a manufacturing method thereof are disclosed. The electronic component package manufacturing method, which includes mounting an electronic component in one surface of a first insulation layer; bonding a heat sink to the one surface of the first insulation layer, corresponding to the electronic component, to cover the electronic component, the heat sink being formed with a cavity; charging the cavity with an adhesive; and forming a circuit pattern in the other surface of the first insulation layer, can prevent a void from being generated in the adhesive, make the handling stable and make the size small by allowing the heat sink formed with the cavity to cover the electronic component before the pattern build-up and supplying the adhesive through one side of the cavity while providing negative pressure through the other side.

5 Claims, 26 Drawing Sheets

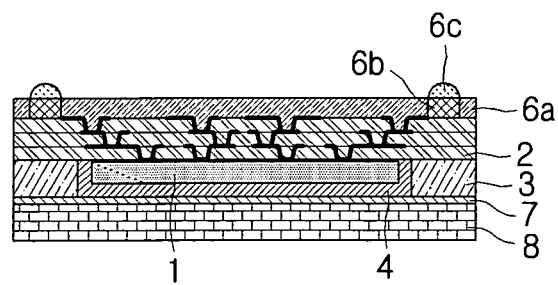

ELECTRONIC COMPONENT PACKAGE AND MANUFACTURING METHOD THEREOF

CROSS-REFERENCE TO RELATED PATENT APPLICATIONS

This application claims the benefit of Korean Patent Application No. 10-2007-0020940, filed on Mar. 2, 2007, in the Korean Intellectual Property Office, the disclosure of which is incorporated herein in its entirety by reference.

BACKGROUND OF THE INVENTION

1. Field of the Invention

The present invention relates to an electronic component package and a manufacturing method thereof.

2. Background Art

Today's trend of the current electronic part industry shows that the number of input/output of chips has risen sharply, and the package is multifunctional and multiplex. Accordingly, a chip scale package that packages a chip scale as it is without using a solder and a solder bump of a flip chip ball grid array (BGA) has been developed.

FIG. 1A through 1K illustrate an electronic component package manufacturing method in accordance with a conventional art, and FIG. 2 is a sectional view showing an electronic component package in accordance with a convention art. As shown in FIG. 1 and FIG. 2, according to the electronic component package manufacturing method in accordance with the conventional art, a void may be generated in the process of molding a chip 1. Since the process of assembling a heat sink and lay-up process, for example, are performed after the chip 1 is molded in a flexible printed circuit board 2 by using a dam member 3 and an adhesive 4, the handling may be unstably performed.

Also, as shown in FIG. 2, the durability may be lowered due to allowing the heat sink 8 to be coupled to the dam member 3 by use of an adhesive 7, and the heat-emitting efficiency may be lowered due to the structure in which only one side surface of the electronic component 1 is arranged facing the heat sink 8.

SUMMARY OF THE INVENTION

The present invention provides a method capable of reducing the possibility that a void may be generated when an electronic component is molded by using the difference in air pressure.

An aspect of the present invention features an electronic component package manufacturing method, including mounting an electronic component in one surface of a first insulation layer; bonding a heat sink to the one surface of the first insulation layer, corresponding to the electronic component, to cover the electronic component, the heat sink being formed with a cavity; charging the cavity with an adhesive; and forming a circuit pattern in the other surface of the first insulation layer.

The heat sink can be formed with an inset hole for supplying the adhesive to the cavity and an inlet hole for providing negative pressure to the cavity, and a step for charging with the adhesive can include providing negative pressure to the cavity through the inlet hole; and supplying the adhesive to the cavity through the insert hole. At this time, the inset hole and the inlet hole can be formed in surfaces, respectively, facing each other.

The adhesive consists of a material including a thermal interface material (TIM), and the first insulation layer can consist of a material including polyimide. In the meantime, the method can further include stacking a lay-up layer in the other surface of the first insulation layer.

Another aspect of the present invention features an electronic component package, including a first insulation layer; an electronic component, mounted in one surface of the first insulation layer; a heat sink, formed with a cavity corresponding to the electronic component and bonded to the one surface of the first insulation layer to cover the electronic component; an adhesive, charged in the cavity; and a circuit pattern, formed in the other surface of the first insulation layer. The heat sink can be formed with an inset hole and an inlet hole, respectively.

The inset hole and the inlet hole can be formed in surfaces, respectively, facing each other, and the adhesive can consist of a material including a thermal interface material (TIM). Also, the first insulation layer can consist of a material including polyimide. The electronic component package can further include a lay-up layer stacked in the other surface of the first insulation layer.

BRIEF DESCRIPTION OF THE DRAWINGS

These and other features, aspects and advantages of the present invention will become better understood with regard to the following description, appended claims and accompanying drawings where:

FIG. 1A through 1K illustrate an electronic component package manufacturing method in accordance with a conventional art;

FIG. 4A through FIG. 4J illustrate the electronic component package manufacturing method of FIG. 3;

DESCRIPTION OF THE EMBODIMENTS

Figure 1A:
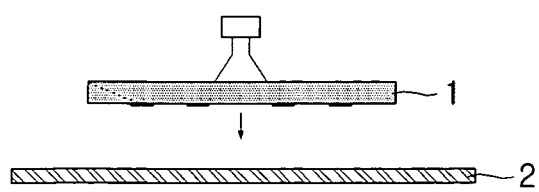
Figure 1B:
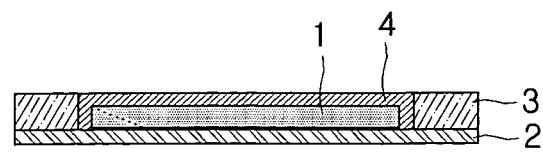
Figure 1C:
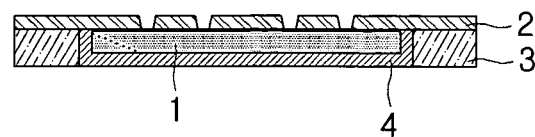
Figure 1D:
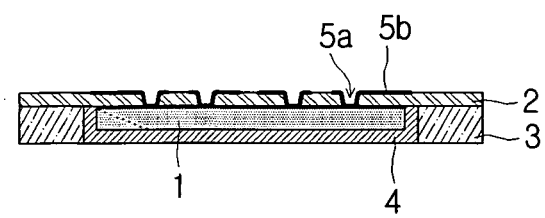
Figure 1E:
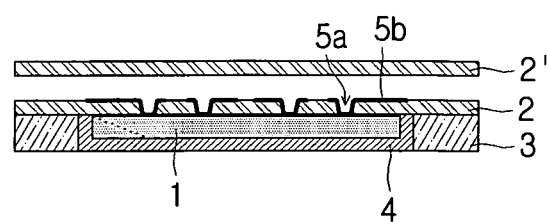
Figure 1F:
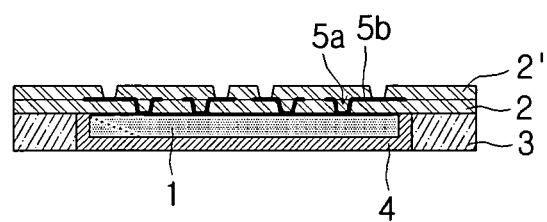
Figure 1G:
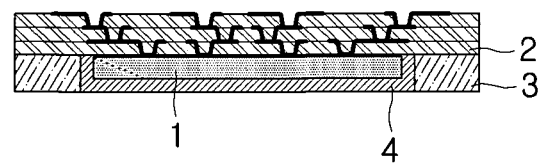
Figure 1H:
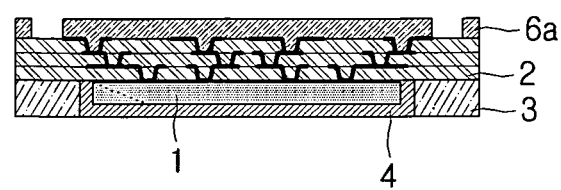
Figure 1I:
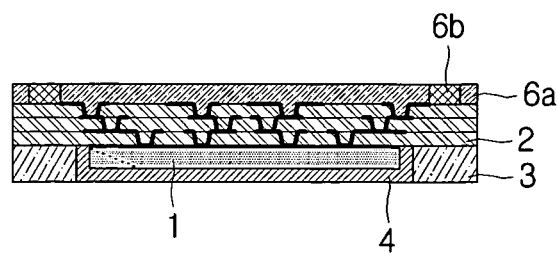
Figure 1J:
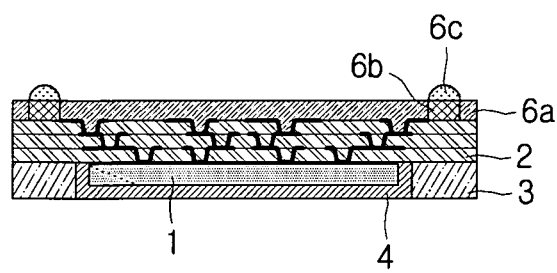
Figure 2:
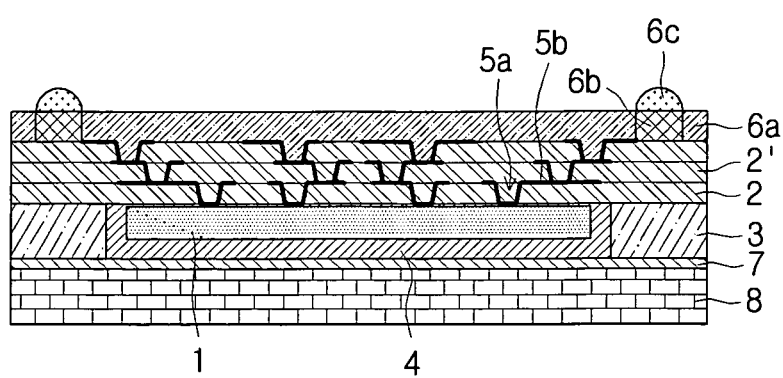
FIG. 2 is a sectional view showing an electronic component package in accordance with a convention art.

Hereinafter, some embodiments of an electronic component package and a manufacturing method thereof in accordance with the present invention will be described in detail with reference to the accompanying drawings. Throughout the drawings, similar or corresponding elements are given similar reference numerals. The pertinent overlapped description will be omitted.

Figure 3:
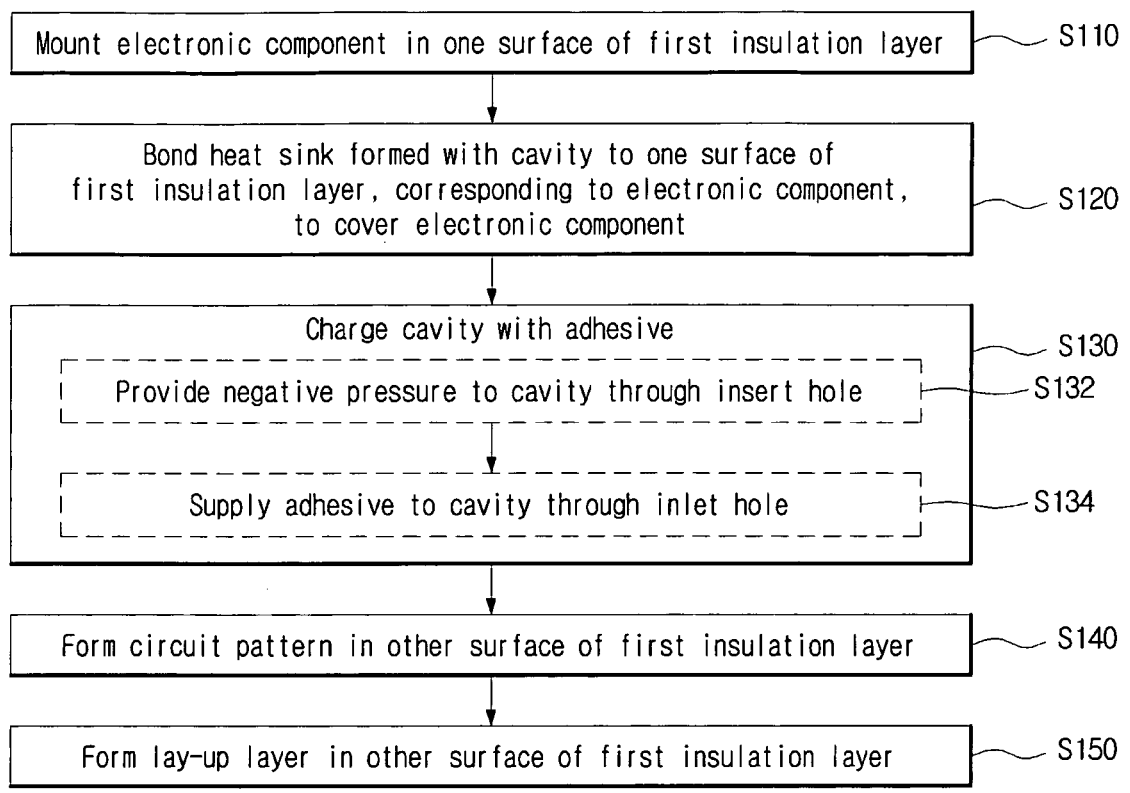
FIG. 3 is a flow chart illustrating an electronic component package manufacturing method in accordance with an embodiment of the present invention.
Figure 4A:
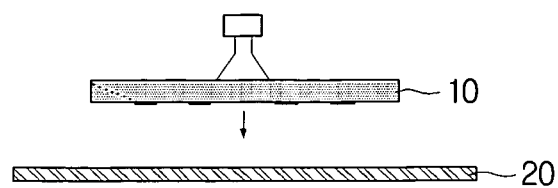
Figure 4B:
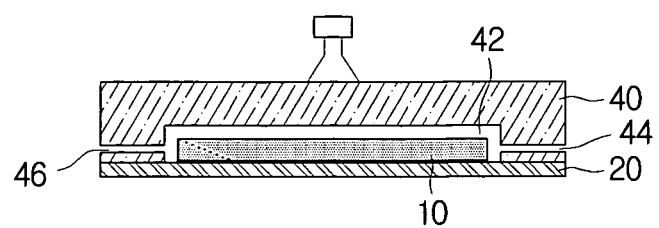
Figure 4C:
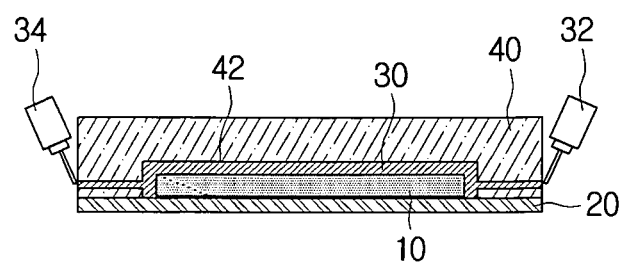
Figure 4D:
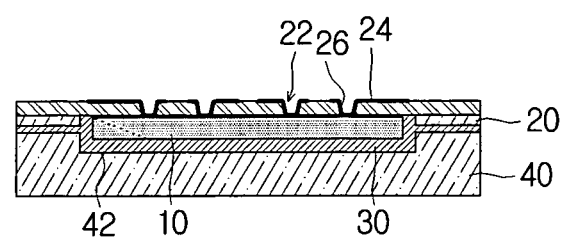
Figure 4E:
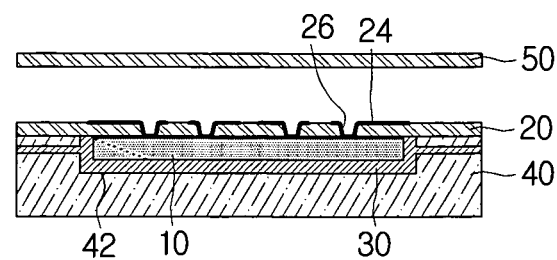
Figure 4F:
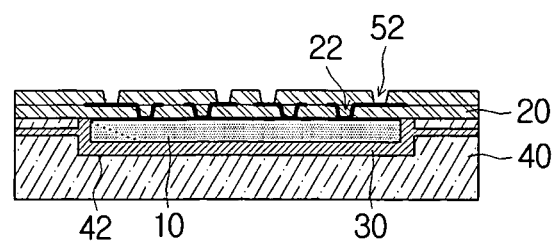
Figure 4G:
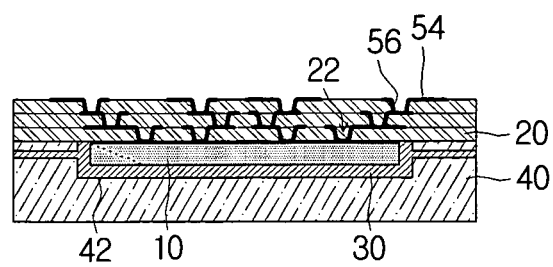
Figure 4H:
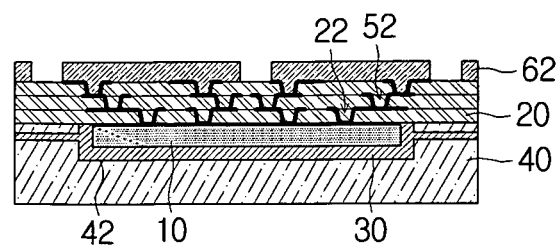
Figure 41:
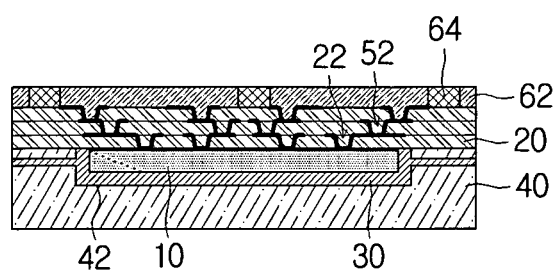
Figure 4J:
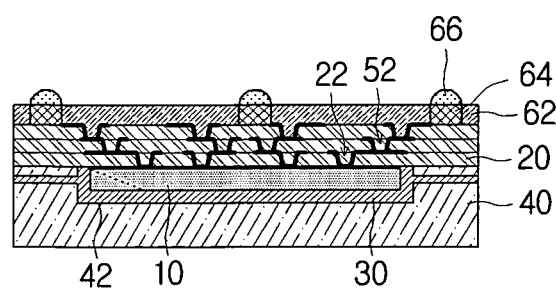
Figure 5A:
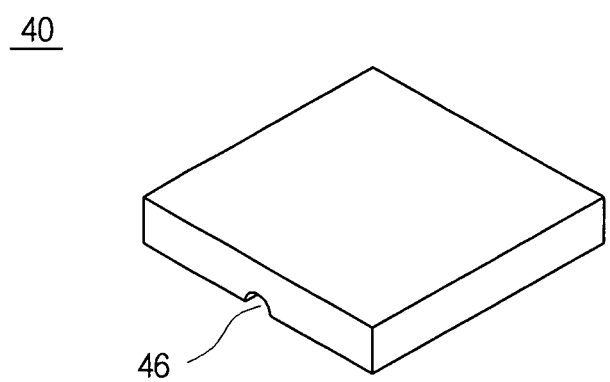
FIG. 5A and FIG. 5B are perspective views showing a heat sink of FIG. 4A through FIG. 4J.
Figure 5B:
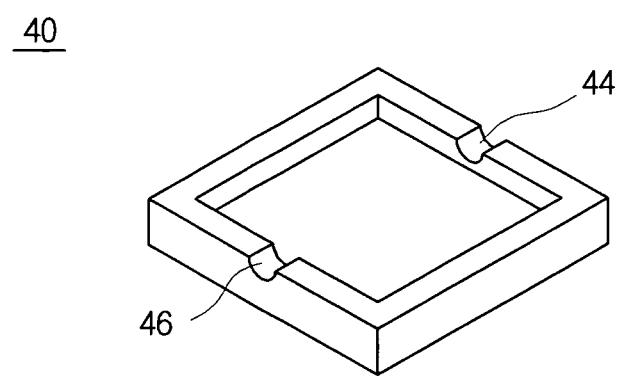

FIG. 3 is a flow chart illustrating an electronic component package manufacturing method in accordance with an aspect of the present invention, FIG. 4A through FIG. 4J illustrate the electronic component package manufacturing method of FIG. 3 and FIG. 5A and FIG. 5B is a perspective view showing a heat sink of FIG. 4A through FIG. 4J. Referring to FIG. 4A through FIG. 4J and FIG. 5A and FIG. 5B, an electronic component 10, a first insulation layer 20, via holes 22 and 52, circuit patterns 24 and 25, plating layers 26 and 56, an adhesive 30, a heat sink 40, a cavity 42, an insert hole 44, an inlet hole 46, a second insulation layer 50, a solder resist 62, a land 64 and a solder bump 66 are illustrated.

Firstly, a step represented by S110 can mount the electronic component 10 in one surface of the first insulation layer 20. For the efficient adhesion, an adhesive material (not shown)

can be applied to the one surface of the first insulation layer 20. The first insulation layer 20 can consist of a component mainly having polyamide which has strong contractiveness and a property in easily making a thin film.

Then, a step represented by S120 can bond the heat sink 40 having the cavity 42 to the one surface of the first insulation layer 20. The heat sink 40 can absolve and transfer the heat generated by the electronic component 10. Herein, the heat sink 40 can consist of copper and aluminum having outstanding thermal conductivity. Of course, the heat sink 40 can consist of other metal components considering the foregoing function.

As shown in FIG. 4B and FIG. 5A and FIG. 5B, the cavity 42 can formed in the heat sink 40. The heat sink 40 can cover a literal side and an upper side of the electronic component 10 by bonding the heat sink 40 to the first insulation layer 20. Accordingly, the heat generated by the electronic component 10 can be more efficiently absolved and transferred. FIG. 5A and FIG. 5B are a plan perspective view and a bottom perspective view, respectively, showing the heat sink 40.

Then, a step represented by S130 can charge the cavity 42 with the adhesive 30. The charged amount of the adhesive 30 can be determined according to the consideration such as the volume of the electronic component. In other words, the adhesive 30 can be charged as much as the volume of the space formed between the electronic component 10 and an internal wall of the heat sink 40.

However, unevenly supplying the adhesive 30 to the cavity 42 may generate a void in case that the cavity 42 is charged with the adhesive 30.

To prevent the void from being generated, the following method can be used. The inset hole 44 and the inlet hole 46 can be formed in the heat sink 40. While the cavity 42 is provided with negative pressure through the inlet hole 46, the adhesive 30 can be supplied to the cavity through the insert hole 44. The means such as a compressor can be used to provide the negative pressure to the cavity 42. The reference number 32 of FIG. 4C indicates the means supplying the adhesive 30, and the reference number 34 indicates the means providing the negative pressure to the cavity 40.

Pressure difference may be generated inside the cavity 42 by the insert hole 44, the inlet hole 46 and the compressor. The pressure difference can make the adhesive 30 evenly spread inside the cavity 42, to thereby prevent the void from being generated.

To form a smoother flow of pressure, the insert hole 44 and the inlet hole 46 can be formed in the surfaces facing each other. As shown in FIGS. 4A through 4J and FIG. 5 and FIG. 5B, the insert hole 44 and the inlet hole 46 can be formed in the sides facing each other. Alternatively, it is natural that both the insert hole 44 and the inlet hole 46 can be formed in a lower part of the heat sink 40.

The adhesive 30 can perform the function of efficiently transferring the heat generated by the electronic component 10 to the heat sink 40 as well as strongly supporting the electronic component 10. Herein, the adhesive 30 can employ a thermal interface material (TIM).

Then, a step represented by S140 can form the circuit pattern 24 in the other surface of the first insulation layer 20. Also, a via can be formed to electrically interconnecting the circuit pattern 24 and the electronic component 10 in addition to the circuit pattern 24. In other words, as shown in FIG. 4D, the via can be formed by forming the via hole 22 penetrating the insulation layer 20 and the plating layer 26. Of course, the method described through FIGS. 4A through 4J is an example for the via formation method. Alternatively, the circuit pattern 24 and the electronic component 10 can be electrically interconnected to each other in various ways.

Then, a step represented by S150 can form a lay-up layer in the other surface of the first insulation layer 20. The electronic component package having a multi-layer structure can be formed by forming the lay-up layer. The lay-up layer can be formed through the processes of stacking the second insulation layer 50 (refer to FIG. 4E), punching the via hole 52 (refer to FIG. 4F) and forming the plating layer 56 and the circuit pattern 54 (refer to FIG. 4G). After that, in a top outer layer, the solder resist 62 can be applied (refer to FIG. 4H), and the land 64 can be formed (refer to FIG. 4I). Then, the solder bump 66 can be formed (refer to FIG. 4J).

The above description is related to the electronic component package manufacturing method in accordance with an aspect of the present invention. Hereinafter, the electronic component package manufacturing method in accordance with another aspect of the present invention will be described.

Figure 6:
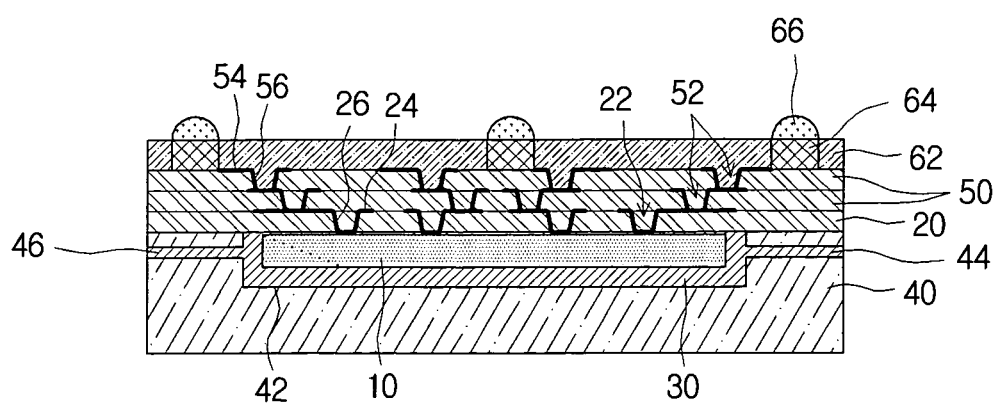
FIG. 6 is a sectional view showing an electronic component package in accordance with another aspect of the present invention.

FIG. 6 is a sectional view showing an electronic component package in accordance with another embodiment of the present invention. Referring to FIG. 6, an electronic component 10, a first insulation layer 20, a via holes 22, a circuit patterns 24, a plating layers 26, an adhesive 30, a heat sink 40, a cavity 42, an insert hole 44, an inlet hole 46, a second insulation layer 50, a solder resist 62, a land 64 and a solder bump 66 are illustrated.

The electronic component 10 can be mounted in one surface of the first insulation layer 20. To strongly mount the electronic component 10, the adhesive layer 30 can be formed in the one surface of the first insulation layer 20. The first insulation layer 20 can employ polyamide having strong contractiveness and a property in easily making a thin film. The electronic component 10, which is mounted in the first insulation layer 20 in a face down type, is illustrated in FIG. 6.

The heat sink 40 can be bonded to the one surface of the first insulation layer 20 in which the electronic component is mounted. The heat sink 40 can be formed with the cavity 42 corresponding to the heat sink 40, to thereby cover the electronic component 10. As shown in FIGS. 5A and 5B and FIG. 6, the heat sink 40 in which the cavity 42 is formed, can cover both a literal side and a lower side of the electronic component 10. This structure can make the area size of the heat sink 40 increased, to thereby improve the emitting heat efficiency.

The heat sink 40 can absolve and transfer the heat generated by the electronic component 10. Herein, the heat sink 40 can consist of copper and aluminum having outstanding thermal conductivity. Of course, the heat sink 40 can consist of other metal components considering the foregoing function.

A space between an internal wall of the heat sink 40 and the electronic component, which is the remaining space of the cavity 42, can be charged with the adhesive 30. The adhesive 30 can strongly support the electronic component 10 to allow the electronic component 10 to be accommodated into the cavity 42 of the heat sink 40.

Also, the adhesive 30 can transfer the heat generated by the electronic component 10 to the heat sink 40. To more efficiently perform the heat-transfer function, the adhesive 30 can employ a thermal interface material (TIM).

Since the method of charging with the adhesive 30 is the same as described through the aforementioned electronic component package manufacturing method, the pertinent detailed description will be omitted.

A circuit pattern 24 can be formed in the other surface of the first insulation layer 20. In accordance with the embodiment of the present invention, the electronic component package can perform a predetermined function through the means such as the circuit pattern 24. The circuit pattern 24 can be electrically interconnected to an electrode of the electronic component through a via formed in the first insulation layer 20.

To realize a multi-layer electronic component package, a lay-up layer can be formed in the other surface the first insulation layer 20. Since the method of stacking the lay-up layer is the same as described through the aforementioned electronic component package manufacturing method, the pertinent detailed description will be omitted.

A lot of other embodiments can described within the principles and spirit of the invention, the scope of which shall be defined by the appended claims.

What is claimed is:

1. An electronic component package manufacturing method, comprising:
   mounting an electronic component in one surface of a first insulation layer;
   bonding a heat sink to the one surface of the first insulation layer, corresponding to the electronic component, to cover the electronic component, the heat sink being formed with a cavity, an inset hole to supply the adhesive to the cavity, and an inlet hole to provide negative pressure to the cavity;
   charging the cavity with an adhesive, the charging with the adhesive comprising
     providing negative pressure to the cavity through the inlet hole, and
     supplying the adhesive to the cavity through the insert hole; and
   forming a circuit pattern in the other surface of the first insulation layer.

2. The method of claim 1, wherein the inset hole and the inlet hole are formed in surfaces, respectively, facing each other.

3. The method of claim 1, wherein the adhesive consists of a material including a thermal interface material (TIM).

4. The method of claim 1, wherein the first insulation layer consists of a material including polyimide.

5. The method of claim 1, further comprising stacking a lay-up layer in the other surface of the first insulation layer.

* * * * *